(12) United States Patent
Young et al.

(10) Patent No.: US 8,995,745 B2
(45) Date of Patent: Mar. 31, 2015

(54) SEQUENCER FOR COMBINING AUTOMATED AND MANUAL-ASSISTANCE JOBS IN A CHARGED PARTICLE BEAM DEVICE

(75) Inventors: Richard J. Young, Beaverton, OR (US);
Ryan Tanner, Beaverton, OR (US);
Reinier Louis Warschauer, Portland, OR (US)

(73) Assignee: FEI Company, Hillsboro, OR (US)

( * ) Notice: Subject to any disclaimer, the term of this patent is extended or adjusted under 35 U.S.C. 154(b) by 259 days.

(21) Appl. No.: 13/562,785

(22) Filed: Jul. 31, 2012

(65) Prior Publication Data

US 2014/0037185 A1 Feb. 6, 2014

(51) Int. Cl.
*G06K 9/00* (2006.01)
*H01J 37/26* (2006.01)
*H01J 37/28* (2006.01)

(52) U.S. Cl.
CPC .............. *H01J 37/265* (2013.01); *H01J 37/28* (2013.01); *H01J 2237/221* (2013.01); *H01J 2237/31749* (2013.01)
USPC .......................................... 382/145; 382/144

(58) Field of Classification Search
USPC .................................................. 382/145, 149
See application file for complete search history.

(56) References Cited

U.S. PATENT DOCUMENTS

| | | | | |
|---|---|---|---|---|
| 5,826,040 A * | 10/1998 | Fargher et al. | ............... | 705/7.24 |
| 6,238,940 B1 * | 5/2001 | Steffan et al. | .................... | 438/14 |
| 6,744,266 B2 * | 6/2004 | Dor et al. | ................. | 324/754.22 |
| 6,889,113 B2 | 5/2005 | Tasker et al. | | |
| 7,308,334 B2 | 12/2007 | Tasker et al. | | |
| 7,664,566 B2 | 2/2010 | Tasker et al. | | |
| 8,095,231 B2 | 1/2012 | Tasker et al. | | |
| 8,442,300 B2 * | 5/2013 | Tsuneta et al. | ................ | 382/145 |
| 8,775,148 B2 * | 7/2014 | Pannese et al. | .................. | 703/13 |
| 2007/0093929 A1 * | 4/2007 | Kreidler et al. | ............... | 700/169 |
| 2008/0147580 A1 * | 6/2008 | Pannese | .......................... | 706/33 |
| 2011/0252405 A1 * | 10/2011 | Meirman et al. | .............. | 717/125 |
| 2013/0076892 A1 * | 3/2013 | Nahum et al. | ................ | 348/135 |
| 2014/0037185 A1 * | 2/2014 | YOUNG et al. | .............. | 382/145 |

* cited by examiner

*Primary Examiner* — Gregory M Desire
(74) *Attorney, Agent, or Firm* — Scheinberg & Associates, PC; Michael O. Scheinberg

(57) ABSTRACT

A device for imaging and processing a workpiece having nanometric features through the use of at least one charged particle beam, by both fully automated procedures and manual assistance procedures. The device includes a user interface, including a schedule input entry device and a human operator ready input that can be placed in a first state or a second state and a procedure scheduler, accepting a schedule of procedures, including fully automated procedures and manual assistance procedures, from the schedule input entry device. Additionally, a procedure sequencer that, when the human operator ready input is in the second state, sequences through fully automated procedures until the human operator ready input is placed into the first state, at which time the sequencer begins sequencing the manual assistance procedures, after reaching a safe termination point for the fully automated procedures being performed.

22 Claims, 8 Drawing Sheets

SEQUENCER FOR COMBINING AUTOMATED AND MANUAL-ASSISTANCE JOBS IN A CHARGED PARTICLE BEAM DEVICE

TECHNICAL FIELD OF THE INVENTION

The present invention relates to dynamic job scheduling for a machine workstation that performs both automated jobs and jobs requiring manual assistance.

BACKGROUND OF THE INVENTION

In the world of manufacturing, integrated circuit wafers having nanometric features provide a profound challenge to the makers of equipment for inspecting the wafers for defects, and analyzing any defects found. Among devices that must evolve to meet the challenge are defect analyzers, devices for excising and preparing lamella from an IC die for imaging by a scanning transmission electron microscope (STEM) or a transmission electron microscope (TEM), referred to below as "TEM prep devices," and critical dimension metrology STEM and TEM devices.

A defect analyzer is a machine that examines an etched semiconductor wafer, to find and analyze any defects in the wafer fabrication. One type of defect analyzer includes both a scanning electron microscope for surface inspection, and a focused ion beam (FIB) for micro-machining into the wafer to permit inspection of otherwise hidden surfaces. Many operations of a defect analyzer, similar to other machines, may be performed entirely automatically. For example, determining if a surface pattern sufficiently matches a predetermined template typically requires no human manual assistance. Other operations, such as further milling address instances in which there is not a sufficient match to wafer specifications, do require manual assistance.

TEM prep devices require cutting into the die with an FIB. It is also sometimes necessary to remove material from the lamella being excised (through micro-machining), thereby thinning the lamella to the point that the electron beam of a TEM or STEM can travel through it. Although a fair amount of thinning can be done automatically, determining when to stop may require human judgment. For example, if a lamella must be 80 nm thick to contain the feature of interest, an automated process may stop thinning at a safe 150 nm thickness. But after that point it may be necessary to have a human operator view the operation, to determine at what point the feature has been revealed, and the process can be stopped.

A critical metrology TEM or STEM is a device that is used to measure features of a die (typically excised on a lamella), to verify correct dimensionality. Although much of this measurement can be done automatically, in some instances human judgment is necessary to properly focus the device, or to determine the end points of a feature, where the boundaries are not clear.

For all of the above described devices, there may be instances in which the device automatically recognizes that human assistance is required. This type of human assist task would be impossible to predict in advance.

In one currently available device it is possible to schedule automatically performed tasks and manual assistance tasks. But the scheduling is not dynamic, so that when the schedule reaches a point where a task requiring manual assistance is to be performed, the machine finishes the last fully automatic task and stops performance until a human operator arrives to perform the manual assistance task. Likewise, when a human operator must leave before he is finished with a manual assistance task, there is no way to cause the machine to resume performing the fully automated tasks.

Because defect analyzers typically work on wafers that are loaded in sequence, there is generally a virtually infinite amount of work to be done on the train of wafers. Also, a wafer already treated by the defect analyzer can be reloaded into the machine later, for further treatment. Accordingly, even a manual task scheduled as the last job to be performed on a particular wafer can nevertheless cause a needless interruption in machine function, as it prevents the loading of a subsequent wafer until the manual assistance task is completed.

SUMMARY OF THE INVENTION

The present invention may take the form of a device for imaging and processing a workpiece having nanometric features through the use of at least one charged particle beam, by both fully automated procedures and manual assistance procedures. The device includes a user interface, including a schedule input entry device and a human operator ready input that can be placed in a first state (indicating the human operator is available) or a second state (indicating the human operator is unavailable) and a procedure scheduler, accepting a schedule of procedures, including fully automated procedures and manual assistance procedures, from the schedule input entry device. Additionally included is a procedure sequencer that, when the human operator ready input is in the second state, sequences through fully automated procedures until the human operator ready input is placed into the first state, at which time the sequencer begins sequencing the manual assistance procedures, after reaching a safe termination point for the fully automated procedures being performed. In one preferred embodiment the schedule input entry device includes a port for accepting a schedule from a remote device, which may be part of a larger automation network.

In a separate aspect, the invention may take the form of a very similar device, but which transitions from manual assistance procedures to fully automated procedures when the manual assistance ready input changes from first state to second state. In a preferred embodiment a charged particle beam device transitions to manual assistance procedures when the manual assistance ready input is transitioned to the first state and to fully automated procedures when the manual assistance ready input is transitioned to the second state. The invention also encompasses the methods of transitioning procedures when the human operator ready input is transitioned, as described in relation to the charged particle beam device, above.

Accordingly, it is an object of this invention to provide for the fuller utilization of a charged particle device machining station by permit the continued performance of fully automated tasks during periods when no human operator is available. It is a further object of this invention to provide for the fuller utilization of human operators' available time by permitting a human operator to continue to work at a machine, as long as any manual assistance task remains to be completed.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention are directed to a charged particle beam device having an enhanced procedure scheduling capability.

Figure 1:
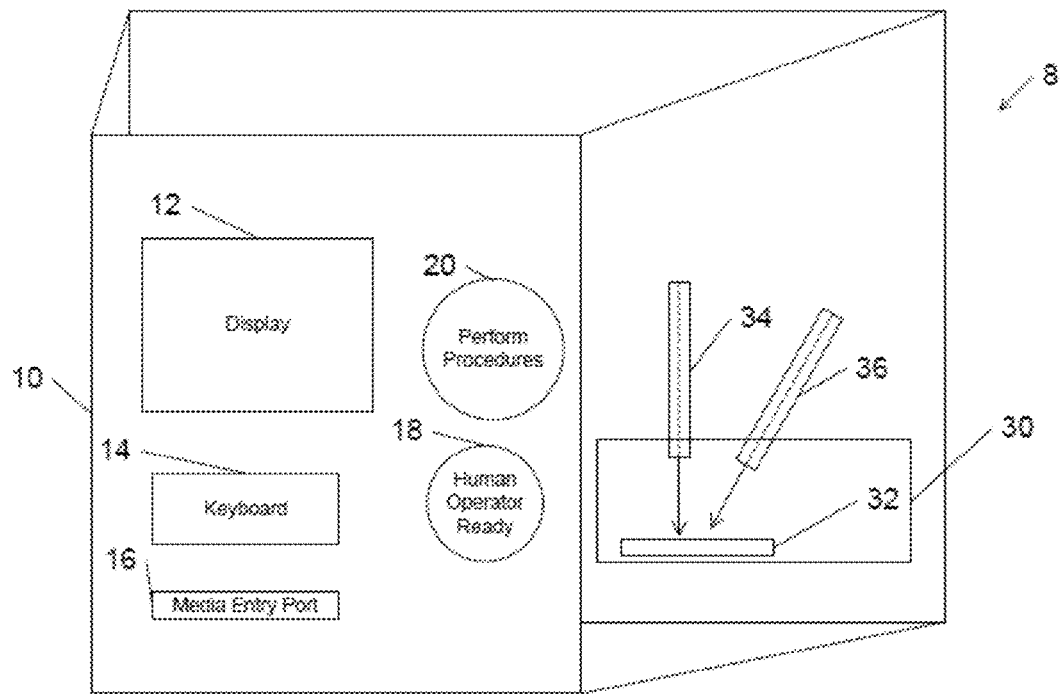
FIG. 1 shows a figurative depiction of a dual charged particle beam device having a user input console, according to the present invention.

Referring to FIG. 1, a micromachining device 8, such as a defect analyzer, has a data input interface 10, that includes a display 12, keyboard 14 and a media entry port 16, for permitting a user to introduce a schedule of procedures. In some instances computer readable media from, for example, an optical inspection device, may include a sequence of procedures for a data analyzer to perform, on sites determined by the optical inspection device to possibly have a defect. A human user may use the keyboard 14 (or may use a keyboard at a remote location via a network) to add procedures, which may be selected from a drop down menu or some other input facilitating mechanism. A human operator ready button 18 can be placed into one of two states, a human operator unavailable state (for example, with the button out), and a human operator ready state (button in, and illuminated). Whichever state button 18 is in, a brief press toggles to the other state. In an alternative preferred embodiment a toggle switch is used instead of button 18. Also, an "on" or "perform procedures" button 20 must be in its activated state for the charged particle beam device station to begin or continue the sequence of procedures. In one preferred embodiment buttons 18 and 20 are shown on display 12, rather than being a separate physical button. Micromachining device 8 further includes a vacuum chamber 30 in which a workpiece 32 is imaged by a scanning electron microscope (SEM) 36 and machined by an FIB 34.

Figure 2:
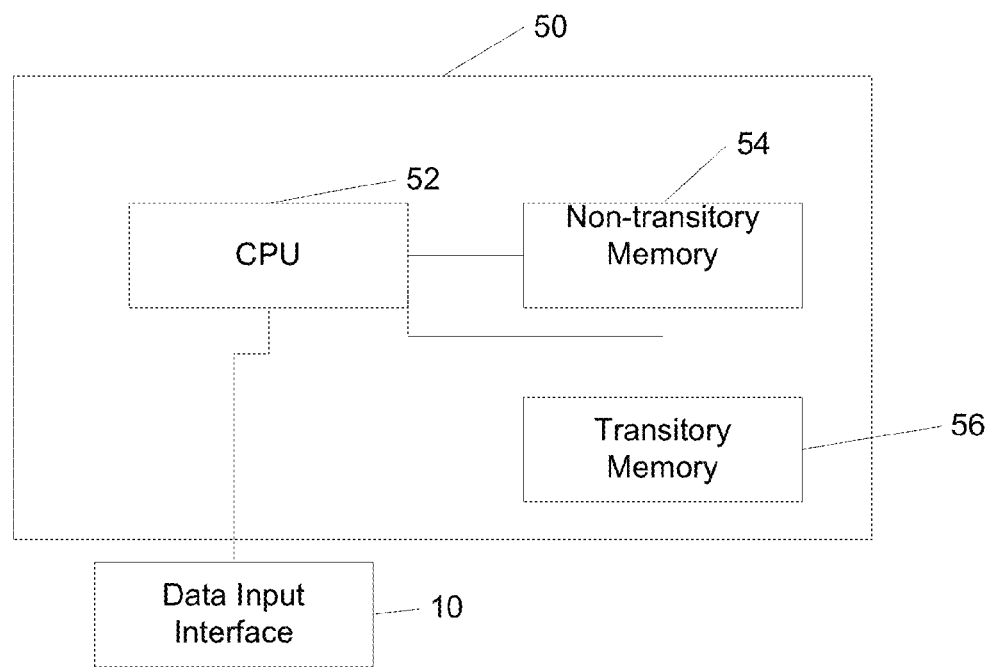
FIG. 2 shows a block diagram of a charged particle beam device control unit, according to the present invention.

Referring to FIG. 2, a charged particle device station sequencer 50 is implemented as a CPU 52, running a program held in non-transitory memory 54. Lists of procedures to be performed are received from the data input interface 10 and stored in transitory memory 56.

Figure 3A:
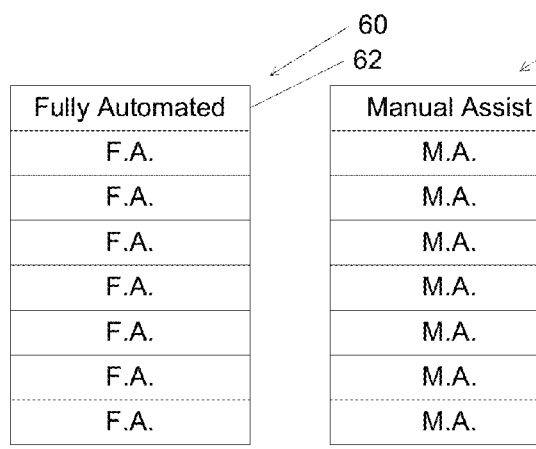
FIG. 3A shows a first method of storing a list of procedures.

Referring to FIG. 3A, in a first system of storing a list of procedures, a list 60 of fully automated procedures 62 is established and maintained, and a separate list 64 of manual assist procedures 66 is also maintained. In an alternative method, shown in FIG. 3B, however, a single list 70 having fully automated procedures 62 and manual assist procedures 66 interspersed is maintained.

Figure 4:
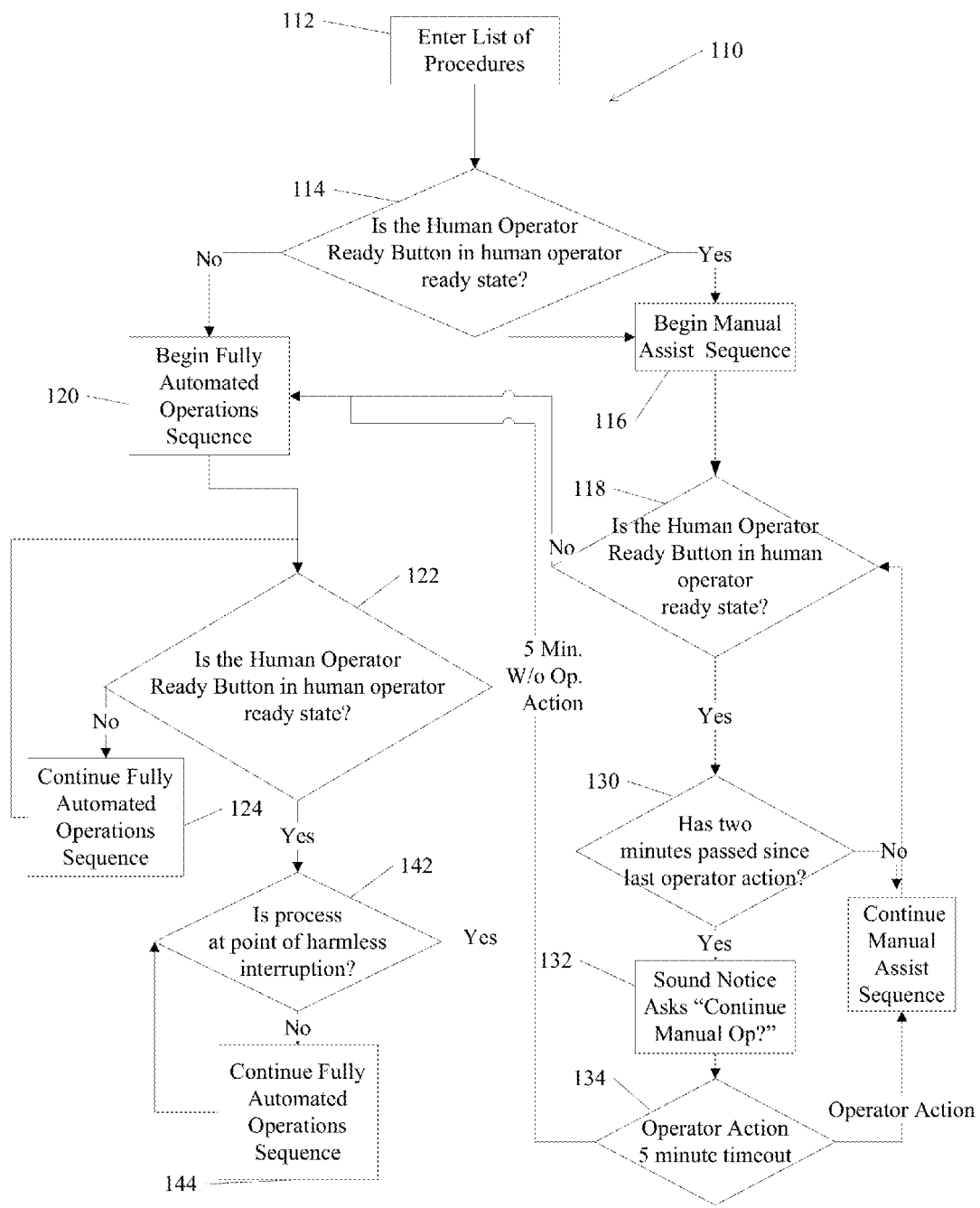
FIG. 4 shows a flow chart of sequencer operation.

Referring now to FIG. 4, operation of sequencer 50 (flowchart 110) begins with the introduction of a set of procedures to be performed (block 112). As noted in the discussion of data input interface 10, this may be done by a list created by another device, for example an automatic optical inspection device, and loaded into media port 16. A human operator may add to the list, or create a list through the use of keyboard 14 and display 12. Presuming that "on" button 20 is activated, the control process next determines if the human operator ready button 18 is in its ready state (decision box 114). If it is, the sequence of procedures begins with the manual assist sequence (block 116), continuing until the human operator ready button 18 is toggled to its human operator unavailable state (decision box 118). If, at decision box 114, it is found that the human operator ready button 18 is in human operator unavailable state, then a sequence of fully automated procedures is begun (block 120), continuing until the human operator ready button 18 is toggled into human operator ready state (decision box 122).

The manual assist sequence process (block 116 and decision box 118) continues until the human operator ready button 18 is toggled to human operator unavailable state at which point operation is transferred to the fully automated procedures (block 120). There is also a timeout feature, which sounds a notice after a user configured time, such as two minutes, of inactivity (decision box 130 and block 132), and begins the fully automated procedures (block 120) after a user configured time, such as five minutes of operator inactivity (decision box 134), so that the system can be used productively if the operator forgets to toggle the human operator ready button 18 when he leaves the machine.

Once in fully automated procedures (block 120), operation continues (decision box 122 and block 124) until button 18 is toggled (decision box 122). The system continues to perform the fully automated procedure (block 144) until a harmless interrupt point is reached (decision box 142), at which point operation is transferred to manual assist procedures (block 116). If the manual assist procedure list 64 is empty, the human operator is notified and presumptively de-activates the human operator ready button 18.

Figure 5:
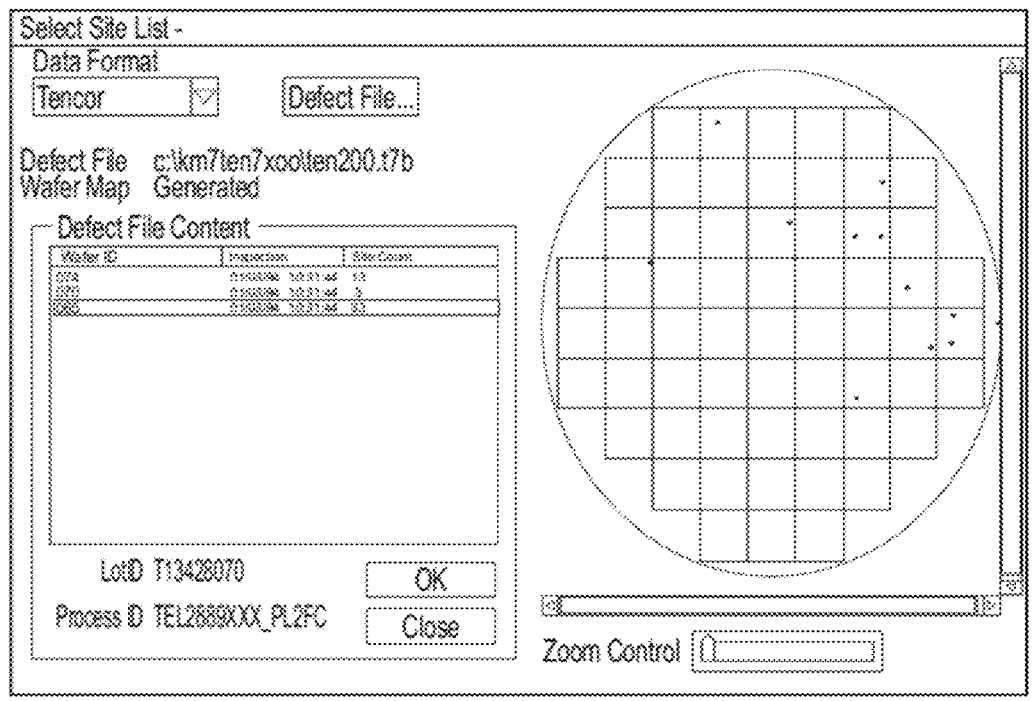
FIG. 5 is an image of a defect analyzer display showing an image of a wafer and displaying defect locations on the wafer.

In the case in which micromachining device 8 is a defect analyzer, the workpiece 32 takes the form of a wafer that has undergone optical inspection. Referring to FIG. 5, a plurality of sites will have been identified for further inspection by the SEM 36, after which the FIB 34 may be used to machine into the wafer 32 to expose a new surface for imaging. In this context, the original imaging may typically be done entirely automatically. Further, an automatic pattern match may be performed in order to form an initial characterization of the defect.

Figure 6:
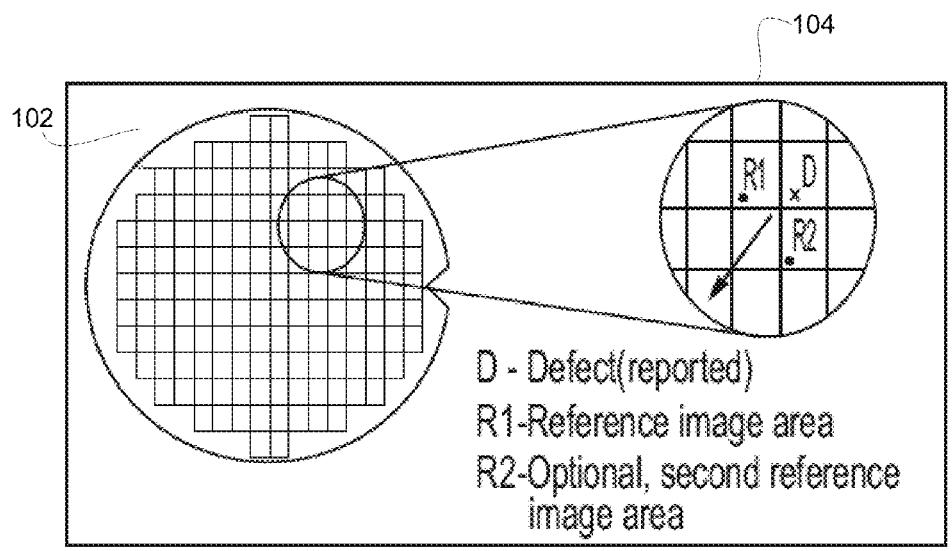
FIG. 6 shows an image of a wafer, and a detail of a wafer area having a defect and showing regions of neighboring prospective dies that will be compared with the defect region.
Figure 7:
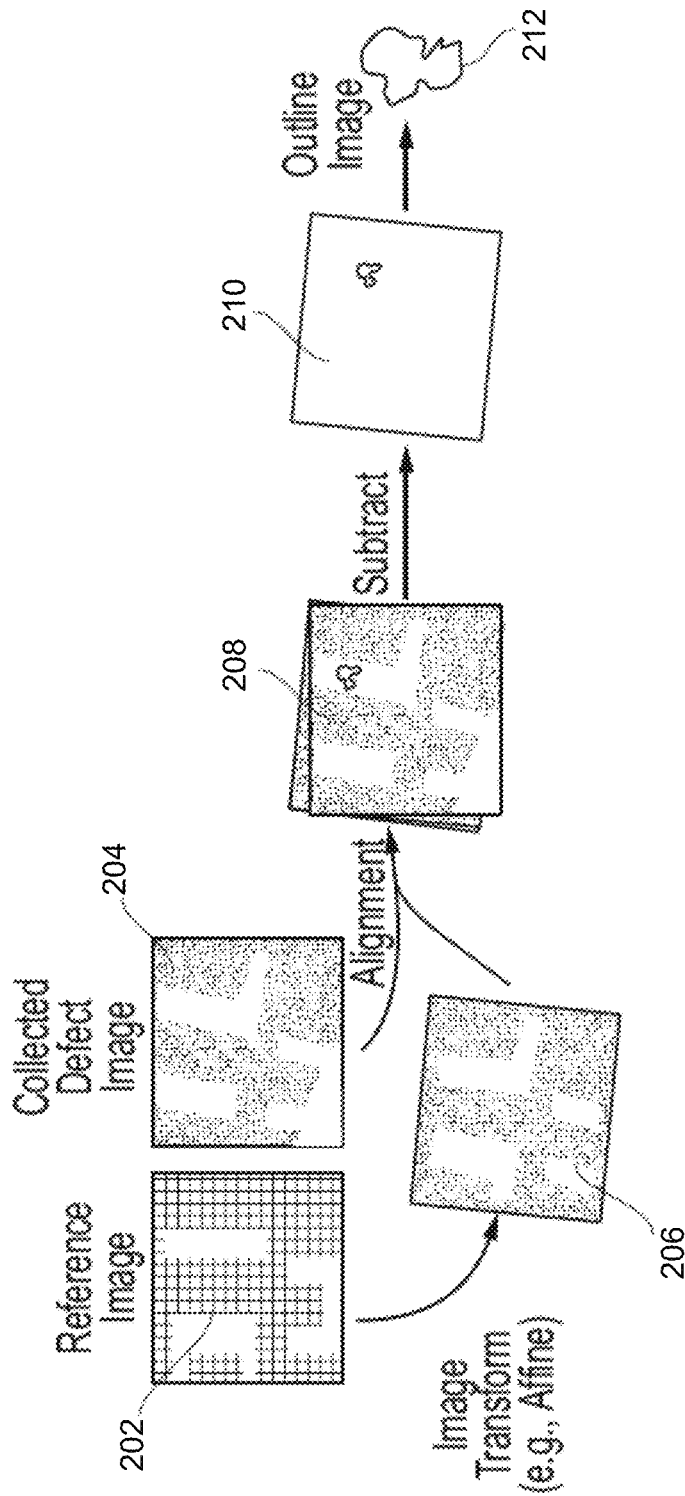
FIG. 7 illustrates the comparison process between the regions of FIG. 6.

Referring to FIGS. 6 and 7, in an exemplary fully automated defect image identification pattern match scheme a defect area D in a region 104 of a wafer 102, is compared with a reference area R1 from a neighboring prospective die, on the same wafer. FIG. 7 is a process diagram showing how a defect may be identified (and/or isolated) from a collected defect image and a reference image. With this scheme, a reference image 202 is compared with (subtracted from) the collected defect image 204. Initially, however, the collected reference image 202 may be transformed ("cleaned up") using a suitable transformation such as an affine transformation into a transformed reference image 206. Before being compared with one another, the images may be aligned, if necessary, as shown at 208. The transformed reference image 206 is then subtracted from the collected defect image 204. The remaining difference image, which includes the defect, is shown at 210. From here, an outline image 212 may be generated and/or refined using suitable image processing techniques. In some instances, however, this process itself may require manual assistance.

Figure 3B:
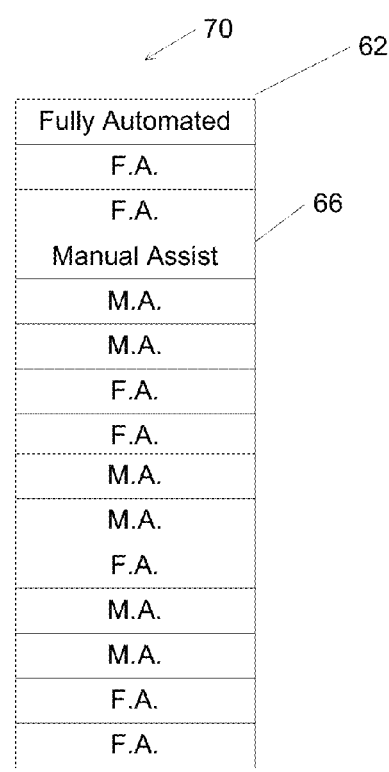
FIG. 3B shows a second method of storing a list of procedures.

The results of this initial pattern match, however, may indicate the need for either a fully automated procedure, or a manual assistance procedure, depending on the result. If the pattern match provides a clear indication of the nature of the defect, it is possible that no further effort be expended. But if the pattern match is indeterminate, then it may be necessary to have a human operator examine the defect and determine a further course of action, or to have a human operator perform some machining into the wafer 32 in order to perform further imaging. In this case, a further human assistance procedure is added to the list of manual assistance procedures 64, if the system of FIG. 3A is used, or the list of all procedures 70, if the system of FIG. 3B is used.

One reason why a manual assistance procedure may be needed in the defect analyzer case, is because it may be necessary to have a human "endpoint" the process, or decide when to stop machining into the wafer with the FIB 34. This is typically done by recognizing a pattern, for example of an electronic device, on the exposed face. Human intelligence may be necessary, for example, to determine when a preliminary pattern gives an indication that machining slightly further into the wafer 32 is likely to expose a surface that shows a final pattern.

Figure 8:
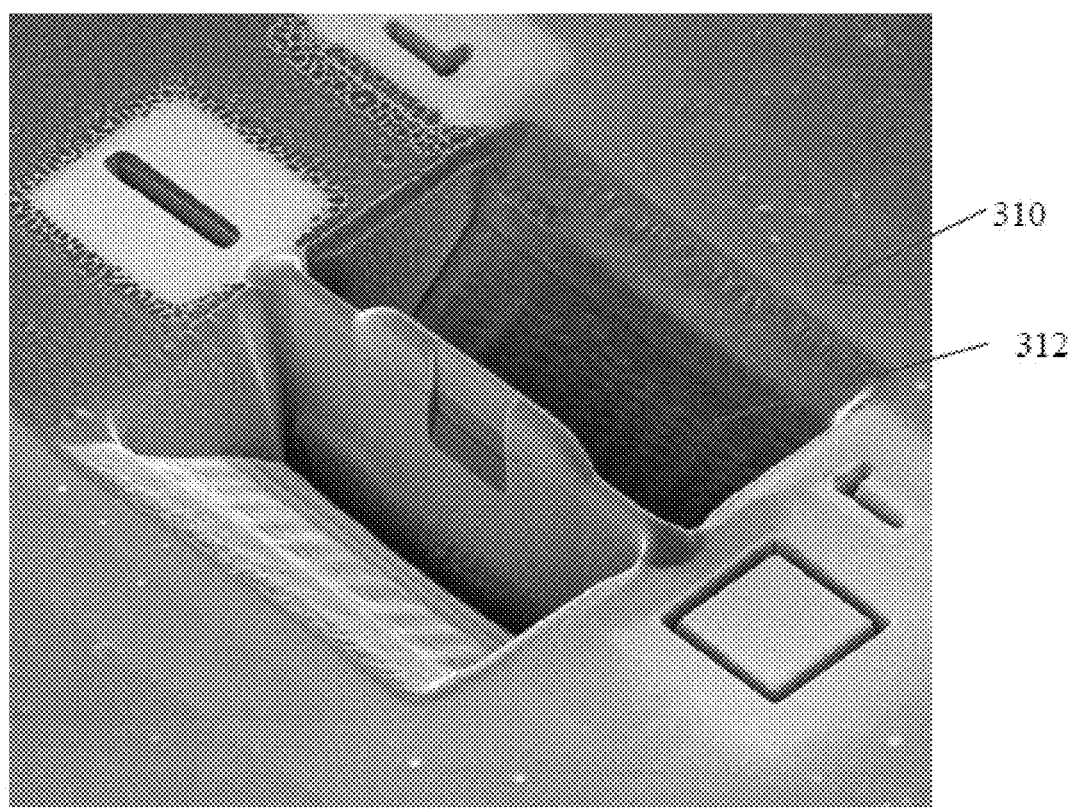
FIG. 8 is a micrograph showing a substrate from which a lamella is in the process of being formed, prior to separation.
Figure 9:
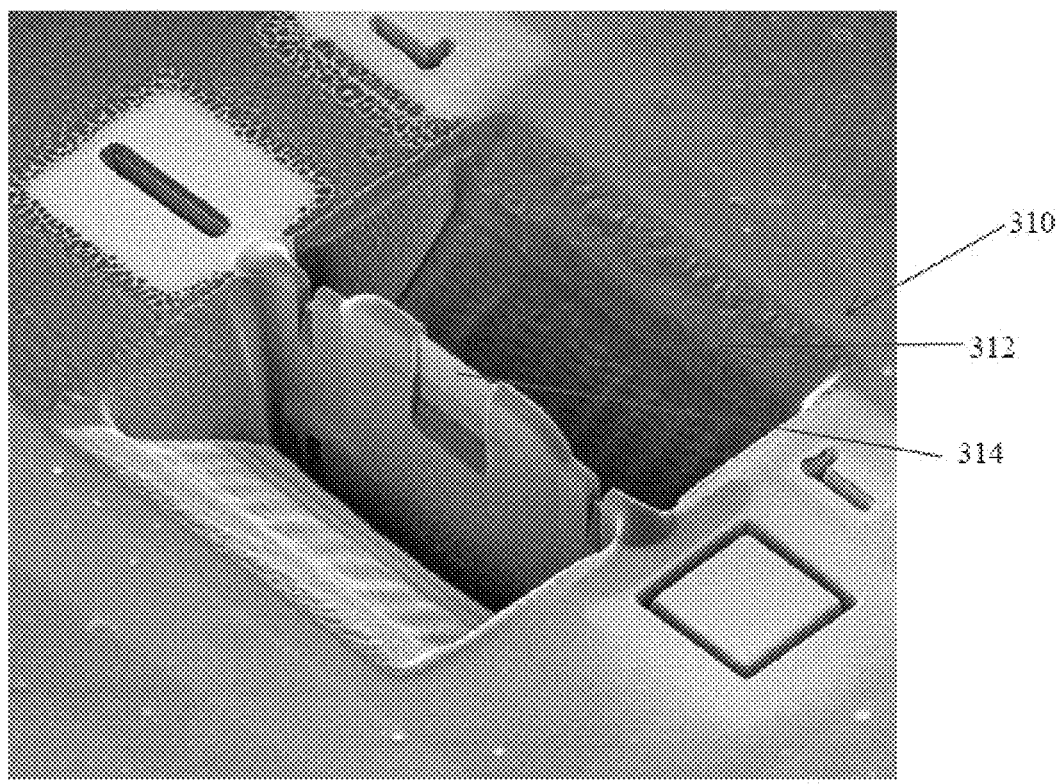
FIG. 9 is a micrograph of the substrate of FIG. 8, at a further stage in the formation of the lamella.
Figure 10:
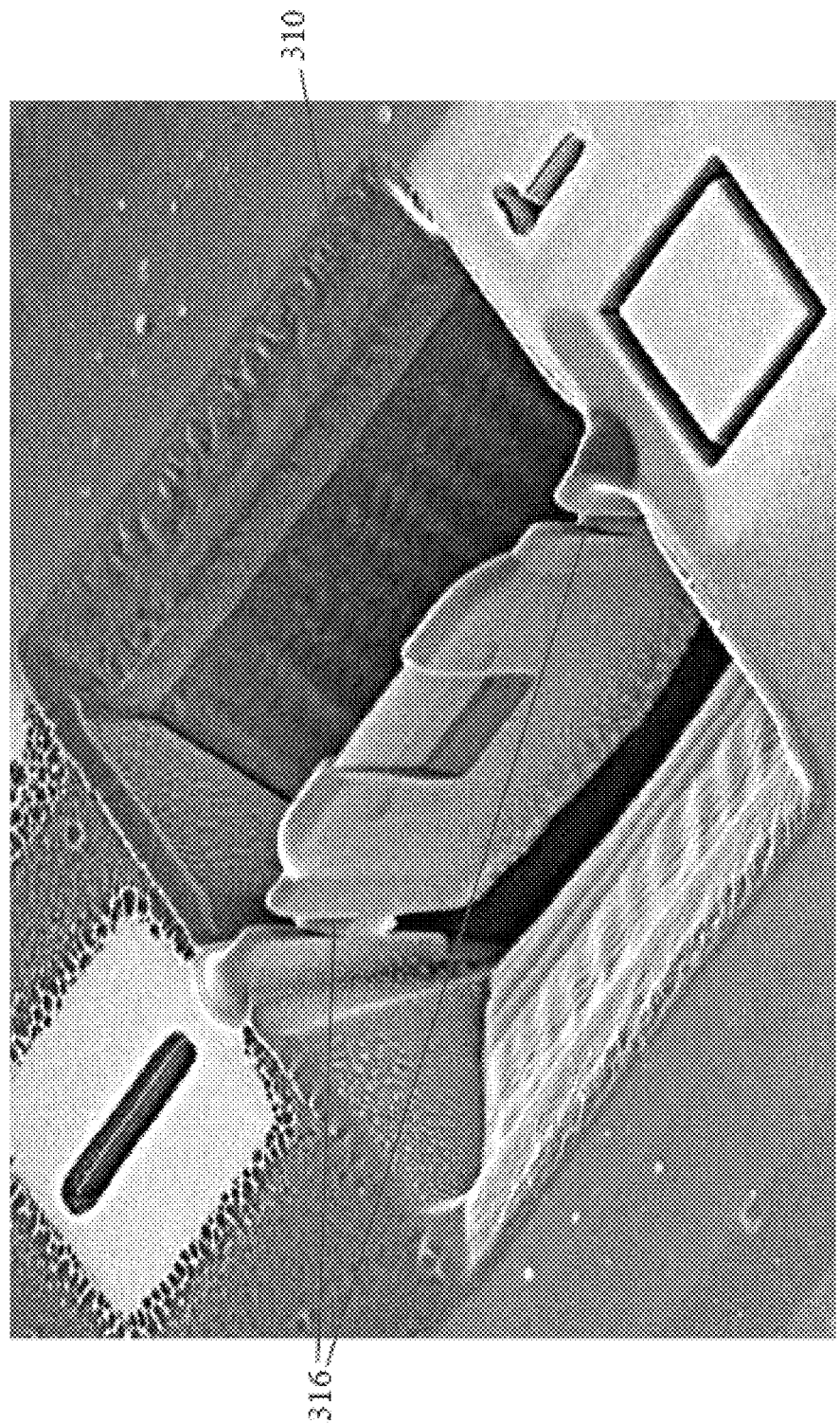
FIG. 10 is a further micrograph of the substrate of FIG. 8, at a final stage in the formation of the lamella.

In the instance in which device 8 is a device for preparing and extracting a lamella from a wafer or die for viewing on a TEM or STEM (collectively S/TEM), a great deal of the extraction process machining can be performed automatically by the FIB. For example, referring to FIGS. 8, 9 and 10, which are micrographs showing a substrate 310 (a die or wafer) in the final stages of the preparation of a lamella, it appears that a great deal of the work up to the point of FIG. 8 is rather gross in nature, with the two side excavations 312 requiring a lot of material removal, which likely would not require human skills. Between FIG. 8 and FIG. 9, however, it may be more difficult to create the very thin portion of the lamella 314, which is to be viewed through the S/TEM, and accordingly this may require manual assisted machining. Finally, FIG. 10 shows the lamella attached to the remainder of the substrate only by very thin tabs 316, the creation of which requires a greater level of skill than the gross machining earlier performed, also presenting a candidate for manually assisted machining.

In a critical dimension metrology S/TEM, a great many of the critical dimension measurements can be made by way of fully automated procedures, but in the event that there is not a clearly visible boundary between regions, human assistance may be required to form a reasonable estimate of the critical dimension.

Skilled persons should now appreciate many of the advantages of the present invention. Rather than periodically sitting idle, when a manual assist procedure is scheduled but the human operator has not returned, the device 8 is utilized whenever there is a procedure which can be performed. If a human operator is available, he or she can work on the device 8, until a stopping point that is convenient to the human operator occurs, rather than being forced off, when a fully automated procedure is scheduled to be performed. Accordingly, device 8 throughput is greatly expanded, and return on investment is much higher.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

We claim as follows:

1. A device for imaging and processing a workpiece having nanometric features through the use of at least one charged particle beam, by both fully automated procedures and manual assistance procedures, comprising:
   a. a charged particle beam system for processing a work piece;
   b. a user interface, including a schedule input entry device and a human operator ready input that indicates whether or not a human operator is available to perform an operation using the charged particle beam and that can be placed in a first state or a second state;
   c. a procedure scheduler, accepting a schedule of procedures, including fully automated charged particle beam procedures and manual assistance charged particle beam procedures, from said schedule input entry device; and
   d. a procedure sequencer that, when said human operator ready input is in said second state, sequences through said fully automated procedures until said human operator ready input is placed into said first state, at which time said sequencer begins sequencing said manual assistance procedures, after reaching a safe termination point for said fully automated procedures being performed.

2. The device of claim 1, wherein said device is a defect analyzer, a critical dimension metrology TEM or STEM, or a TEM preparation device that extracts lamellae from a wafer and prepares them for imaging.

3. The device of claim 1, wherein one manual assistance procedure is determining a process endpoint and/or one fully automated procedure is autothinning.

4. The device of claim 1, wherein said device includes a microprocessor and also includes microprocessor readable non-transitory memory communicatively connected to said microprocessor and having a program that when implemented on said microprocessor implements said scheduler.

5. The device of claim 1 wherein said sequencer maintains a queue of fully automated procedures and a queue of manual assist procedures or a single queue of fully automated procedures interspersed with manual assist procedures.

6. The device of claim 1 wherein said workpiece is one of a train of workpieces sequentially imaged and treated by said device and wherein said sequencer proceeds to a fully automated procedure on a second workpiece in said sequence if all said fully automated procedures have been performed on a first workpiece and said human operator ready input has not been activated.

7. The device of claim 1 wherein said sequencer returns to a manual assistance procedure on said first work piece when said human operator ready input is provided, after having proceeded to a fully automated procedure on said second workpiece.

8. The device of claim 1 wherein said schedule input entry device includes a port connected to a network for receiving said schedule from a remote device.

9. A device for imaging and processing a workpiece having nanometric features through the use of at least one charged particle beam, by both fully automated procedures and manual assistance procedures, comprising:
 a. a charged particle beam;
 b. a user interface, including a schedule input entry device and a human operator ready input that indicates whether or not a human operator is available to perform an operation using the charged particle beam system and that can be placed in a first state or a second state;
 c. a procedure scheduler, accepting a schedule of procedures, including fully automated procedures and manual assistance procedures, from said schedule input entry device; and
 d. a procedure sequencer that, when said human operator ready input is in said first state, sequences through manual assistance procedures until said human operator ready input is placed into said second state, at which time said sequencer begins sequencing said fully automated procedures.

10. The device of claim 9, wherein said device is a defect analyzer.

11. The device of claim 10, wherein a manual assistance procedure is determining a procedure endpoint and/or a fully automated procedure is autothinning.

12. The device of claim 9 wherein said sequencer maintains a queue of fully automated procedures and a queue of manual assist procedures or a single queue of fully automated procedure interspersed with manual assist procedures.

13. The device of claim 9 wherein said workpiece is one of a train of workpieces sequentially imaged and treated by said device and wherein said sequencer proceeds to a manual assistance procedure in a second workpiece in said sequence if all said manual assistance procedures have been performed on a first workpiece and said human operator ready input is still in said first state.

14. The device of claim 13 wherein said sequencer returns to a fully automated procedure on said first work piece when said human operator ready input is deactivated, after having proceeded to a manual assistance procedure on said second workpiece.

15. A method for use in a device for imaging and processing a workpiece having nanometric features through the use of at least one charged particle beam, by both fully automated procedures and manual assistance procedures, said device having a user interface, including a schedule input entry device and a human operator ready input that indicates whether or not a human operator is available to perform an operation and that can be placed in a first state or a second state, said method comprising:
 a. accepting said schedule introduced via said schedule input entry device; and
 b. when said human operator ready input is in said first state, sequencing said manual assistance procedures until said human operator ready input is placed into said second state, and then sequencing said fully automated procedures, the fully automatic procedures including directing the at least one charged particle beam toward the work piece to image or process the work piece.

16. The method of claim 15 wherein said schedule includes a list of fully automated procedures and a separate list of manual assist procedures.

17. The method of claim 15, wherein said device is a defect analyzer; a critical dimension metrology TEM or STEM, or a TEM preparation device that extracts lamellae from a wafer and prepares them for imaging.

18. The method of claim 15 wherein said workpiece is one of a train of workpieces sequentially imaged and treated by said device and wherein said sequence proceeds to a manual assistance procedure on a second workpiece in said sequence if all said manual assistance procedures have been performed on a first workpiece and said human operator ready input is still in said first state.

19. The method of claim 18 wherein said sequence returns to a fully automated procedure on said first work piece when said human operator ready input is placed into said second state, after having proceeded to a manual assistance procedure on said second workpiece.

20. A method for use in a device for imaging and processing a workpiece having nanometric features through the use of at least one charged particle beam, by both fully automated procedures and manual assistance procedures, said device having a user interface, including a schedule input entry device and a human operator ready input that indicates whether or not a human operator is available to perform an operation that can be placed in a first state or a second state, said method comprising:
 a. accepting said schedule introduced via said schedule input entry device; and
 b. when said human operator ready input is in said second state, sequencing said fully automated procedures until said human operator ready input is placed into said first state, and then sequencing said manual assistance procedures, after a safe termination point is reached for said fully automated procedure being performed.

21. The method of claim 20 wherein said schedule includes a list of fully automated procedures and a separate list of manual assist procedures and/or a list of fully automated procedures interspersed with manual assist procedures.

22. The method of claim 20 wherein said workpiece is one of a train of workpieces sequentially imaged and treated by said device and wherein said sequence proceeds to a fully automated procedure on a second workpiece in said sequence if all said fully automated procedures have been performed on a first workpiece and said human operator ready input has not been provided.

* * * * *